(12) United States Patent
Yanagihara et al.

(10) Patent No.: US 9,693,491 B2
(45) Date of Patent: Jun. 27, 2017

(54) SHIELDING UNIT

(71) Applicant: Yazaki Corporation, Minato-ku, Tokyo (JP)

(72) Inventors: Yusuke Yanagihara, Kakegawa (JP); Takashi Ishihara, Kakegawa (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 14/965,951

(22) Filed: Dec. 11, 2015

(65) Prior Publication Data

US 2016/0100509 A1 Apr. 7, 2016

Related U.S. Application Data

(63) Continuation of application No. PCT/JP2014/065861, filed on Jun. 16, 2014.

(30) Foreign Application Priority Data

Jun. 17, 2013 (JP) .................................. 2013-126241

(51) Int. Cl.
*H05K 9/00* (2006.01)
*H01R 9/03* (2006.01)
*H01R 13/6593* (2011.01)

(52) U.S. Cl.
CPC ............... *H05K 9/00* (2013.01); *H01R 9/034* (2013.01); *H01R 13/6593* (2013.01); *H05K 9/0098* (2013.01)

(58) Field of Classification Search
CPC ..... H05K 9/0018; H05K 9/0098; H01R 9/034
See application file for complete search history.

(56) References Cited

U.S. PATENT DOCUMENTS 5,401,177 A * 3/1995 Dutton ............... H01R 13/6593
439/905
8,895,875 B2 * 11/2014 Kato .................... H02G 3/0462
174/359

(Continued)

FOREIGN PATENT DOCUMENTS

JP 03-086577 U 9/1991
JP 2002-329557 A 11/2002

(Continued)

OTHER PUBLICATIONS

Communication dated Oct. 4, 2016 from the Japanese Patent Office in counterpart application No. 2013-126241.

(Continued)

*Primary Examiner* — Hung V Ngo
(74) *Attorney, Agent, or Firm* — Sughrue Mion, PLLC

(57) ABSTRACT

A shielding unit is formed by press-fitting a small diameter portion of a shielding shell into a shielding ring around which an end portion of a shielding member is wrapped, such that the end portion of the shielding member is sandwiched by the shielding ring and the small diameter portion. By having the end portion of the shielding member be folded over to the inside of the shielding ring when press-fitting the small diameter portion of the shielding shell into the shielding ring, even if the position of an opening is unknown, it is possible to reliably position the opening inside the shielding member, unexposed to the outside, after the press-fitting. This easily allows the end portion of the shielding member to be mounted and secured to the shielding shell so as not to be exposed to the outside.

3 Claims, 7 Drawing Sheets

(56) References Cited

U.S. PATENT DOCUMENTS

| | | | |
|---|---|---|---|
| 8,956,189 B2* | 2/2015 | Imahori | H01R 4/10 439/587 |
| 2002/0094724 A1* | 7/2002 | Saito | H01R 9/0518 439/607.41 |
| 2002/0134565 A1* | 9/2002 | Hashizawa | H01R 13/521 174/358 |
| 2003/0221850 A1* | 12/2003 | Mizutani | H01R 13/6592 174/36 |
| 2004/0099427 A1* | 5/2004 | Kihira | B60L 11/1803 174/359 |
| 2005/0266729 A1 | 12/2005 | Fukushima et al. | |
| 2009/0126985 A1* | 5/2009 | Aoki | H02G 3/0683 174/377 |
| 2012/0028500 A1 | 2/2012 | Lee et al. | |
| 2013/0056256 A1* | 3/2013 | Guillanton | H01R 9/0503 174/359 |
| 2013/0087377 A1* | 4/2013 | Adachi | H01R 13/648 174/372 |

FOREIGN PATENT DOCUMENTS

| | | | |
|---|---|---|---|
| JP | 2004-327100 A | | 11/2004 |
| JP | 2005-339933 A | | 12/2005 |
| JP | 2010-153144 A | | 7/2010 |
| JP | 2011258784 | * | 12/2011 |
| JP | 2012-521068 A | | 9/2012 |
| WO | 2010/107197 A2 | | 9/2010 |

OTHER PUBLICATIONS

International Search Report for PCT/JP2014/065861 dated Jul. 29, 2014.

Communication dated Mar. 10, 2017, issued by the German Patent Office in counterpart German Application No. 11201002864.9.

* cited by examiner

SHIELDING UNIT

CROSS REFERENCE TO RELATED APPLICATIONS

This application is a continuation of International Application No. PCT/JP2014/065861, filed Jun. 16, 2014, and based upon and claims the benefit of priority from Japanese Patent Application No. 2013-126241, filed Jun. 17, 2013, the entire contents of all of which are incorporated herein by reference.

BACKGROUND

Technical Field

The present invention relates to a shielding unit constructed by fixing an end of a shielding member to an outside of a cylindrical portion of a shielding shell by a shielding ring.

Related Art

A shielding cable that handles a high voltage for an electric vehicle (EV) or a hybrid electric vehicle (HEV) etc. is provided with a shielding unit electrically connected to a shielding case. The shielding unit includes a shielding member, such as a braided wire covering a bundle of wires, and a shielding shell connected to an open end of the shielding member. When the shielding shell is fixed to the shielding case connected to ground, the shielding member is electrically conducted to the shielding case through the shielding shell, and the bundle of wires covered with the shielding member functions as a shielding cable having a shielding property against high frequency noises.

The connection between the shielding member and the shielding shell is mainly carried out by using either a crimp ring or an internal cylinder and an external cylinder both constituting the shielding shell. In the former case, the end of the shielding member fitted on a cylindrical portion of the shielding shell is crimped from its outside by the crimp ring, thereby fixing the shielding member to the cylindrical portion. In the latter case, the end of the shielding member is sandwiched by the internal cylinder and the external cylinder, thereby fixing the shielding member to the shielding shell (see JP 2002-329557 A).

SUMMARY

In the former method of using the crimp ring of the above-described conventional connection methods, the crimp ring is arranged outside the shielding member immediately before the crimping operation. Therefore, since then, it becomes hard for an operator to visually confirm the position of the shielding member because the crimp ring blocks an operator's field of vision. For this reason, the operation of positioning and crimping the crimp ring in accordance with the position of the end portion of the shielding member is troublesome and it takes a long time to complete the operation.

Furthermore, it sometimes happens that the end portion of the shielding member is projected from the crimp ring after crimping and exposed to the outside. In such a case, if the shielding member is a braided wire, the end portion of the exposed braided wire could become untied to obstruct an operator during the assembling operation about the shielding unit.

Also in the later method of sandwiching the shielding member between the internal cylinder and the external cylinder of the above-described conventional connection methods, such problems occur in a similar way.

Under such a situation as mentioned above, an object of the present invention is to provide a shielding unit which is constructed by attaching a shielding member to a shielding shell and which allows the shielding member to be easily attached and fixed to the shielding shell so as not to expose the end portion of the shielding member to an outside.

In order to attain the above object, a shielding unit according to an aspect of the present invention includes a cylindrical shielding member having electrical conductivity, a shielding shell having a metal cylindrical portion to which an end portion of the shielding member is connected and a shielding ring press-fitted to the cylindrical portion to fix the end portion of the shielding member to the cylindrical portion from an outside thereof. The end portion of the shielding member is folded back from an outer circumferential surface side to an inner circumferential surface side of the shielding ring, thereby winding around the shielding ring. The end portion of the shielding member is sandwiched between the cylindrical portion and the shielding ring.

When press-fitting the cylindrical portion to the shielding ring, the end portion of the shielding member folded back from the outer circumferential surface side to the inner circumferential surface side of the shielding ring is located inside the shielding member. Thus, even if the shield member is a braided wire, there is no possibility that the end portion is exposed to the outside and thus raveled.

Accordingly, when the shielding member is attached to the shielding shell, the end portion of the shielding member can be easily attached and fixed to the shielding shell so as not to be exposed to the outside.

Additionally, by folding back the end portion of the shielding member from the outer circumferential surface side to the inner circumferential surface side of the shielding ring and successively winding the shielding ring around the end portion of the shielding member, the shielding member is locked to the peripheral portion of the shielding ring. Due to this locking, the shielding member is restricted from sliding against the shielding ring for positional deviation when a tensile force is applied to the shielding member in its extending direction.

For this reason, the cylindrical portion of the shielding shell can be press-fitted to the shielding ring while maintaining the length of the end portion of the shielding member folded back to the inside without change and therefore, it is possible to ensure a sufficient contact area between the shielding member and the cylindrical portion of the shielding shell reliably.

The shielding ring may include a locking piece in the form of a cantilever extending to an inside of the shielding ring, and the end portion of the shielding member may be brought into pressure contact with the cylindrical portion under a condition that the end portion of the shielding member is locked to the locking piece thereby preventing the end portion of the shielding member from coming off from the shielding ring.

With this constitution, when press-fitting the cylindrical portion to the shielding ring, the locking piece of the shielding ring allows the end portion, which has been folded back to the inner circumferential surface side of the shielding ring, to come in pressure contact with the cylindrical portion.

Then, as the end portion of the shielding member is locked to the locking piece, even if the shielding member is pulled before pressing-fitting the cylindrical portion of the shielding shell to the shielding ring, it is possible to prevent the end portion of the shielding member, which has been folded back to the inner circumferential surface side of the shielding ring, from coming off from between the shielding ring and the cylindrical portion.

The cylindrical portion may include an elastic contact portion bulging radially outward, and the elastic contact portion may allow the end portion of the shielding member folded back to the inner circumferential surface side of the shielding ring to come into pressure contact with the inner circumferential surface of the shielding ring on condition of press-fitting the cylindrical portion to the shielding ring.

With this constitution, when press-fitting the cylindrical portion to the shielding ring wound with the end portion of the shielding member, the elastic contact portion formed on the cylindrical portion comes into elastic contact with the end portion of the shielding member folded back to the inner circumferential surface side of the shielding ring.

Consequently, by the elastic force of the elastic contact portion, the end portion of the shielding member abuts on the elastic contact portion and the shielding ring with high contact pressure. Thus, it is possible to connect the shielding member to the shielding shell and also connect the shielding member to the shielding ring with excellent electrical conductivity.

With the shielding unit according to the aspect of the present invention, when attaching the shielding member to the shielding shell, it is possible to attach and fix the end portion of the shielding member to the shielding shell so as not to expose the end portion of the shielding member to the outside.

DETAILED DESCRIPTION

Figure 1:
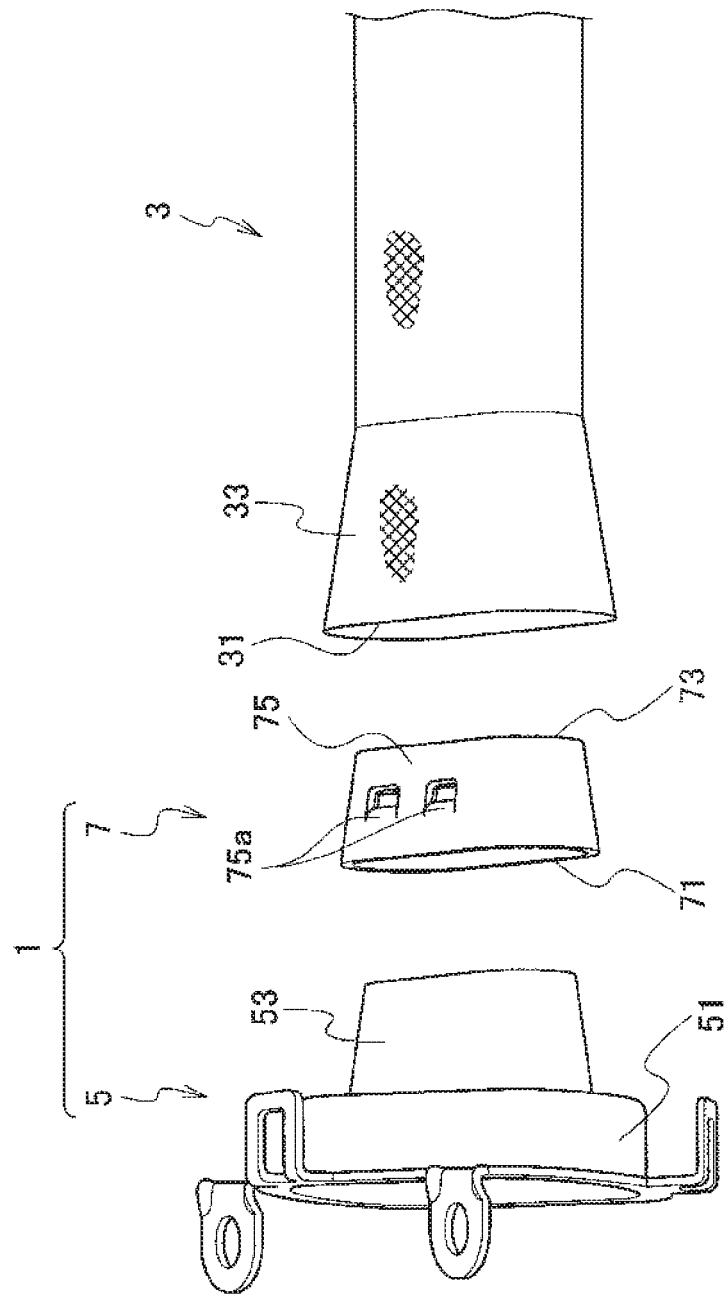
FIG. 1 is an exploded perspective view illustrating a shielding unit according to an embodiment.

A shielding unit according to an embodiment will be described with reference to drawings. In the following description of the drawings, the same or similar portions are designated with the same or similar reference numerals. However, it should be noted that the drawings are consistently typical and therefore, the ratios of respective dimensions are different from actual ratios.

Accordingly, concrete dimensions etc. of respective elements should be evaluated in consideration of the following description. Also in the drawings, additionally, there may be included portions whose mutual relationships or ratios in dimension are different from each other among the drawings.

As illustrated in FIG. 1, a shielding unit 1 according to an embodiment is utilized to construct a shielding cable (not illustrated) by covering a plurality of wire bundles (not illustrated). The shielding unit 1 includes a cylindrical shielding member 3 including a braided wire made of metal, such as aluminum or copper, for covering the wire bundles, a metal cylindrical shielding shell 5 connected to the shielding member 3, and a shielding ring 7 for fixing an end portion 33 of the shielding member 3 in the vicinity of its opening 31 to the shielding shell 5.

The shielding shell 5 includes a large diameter portion 51 for accommodating a connector housing (not illustrated) provided at respective ends of electrical wires, and a small diameter portion 53 as a cylindrical portion, which is continued to the large diameter portion 51 and to which the end portion 33 of the shielding member 3 is connected. The small diameter portion 53 has a tapered shape with an oblong cross section.

The shielding ring 7 is formed with an oblong-shaped cross section slightly larger than the small diameter portion 53. The shielding ring 7 has a tapered shape with a large diameter opening end 71 and a small diameter opening end 73 so as to facilitate a press-fitting of the small diameter portion 53 of the shielding shell 5. In opposing long side portions 75, 75 of the shielding ring 7, locking pieces 75a each in a form of a cantilever are formed so as to project to an interior side of the shielding ring 7.

Next, the procedure of connecting the shielding member 3 to the shielding shell 5 will be described.

Figure 2:
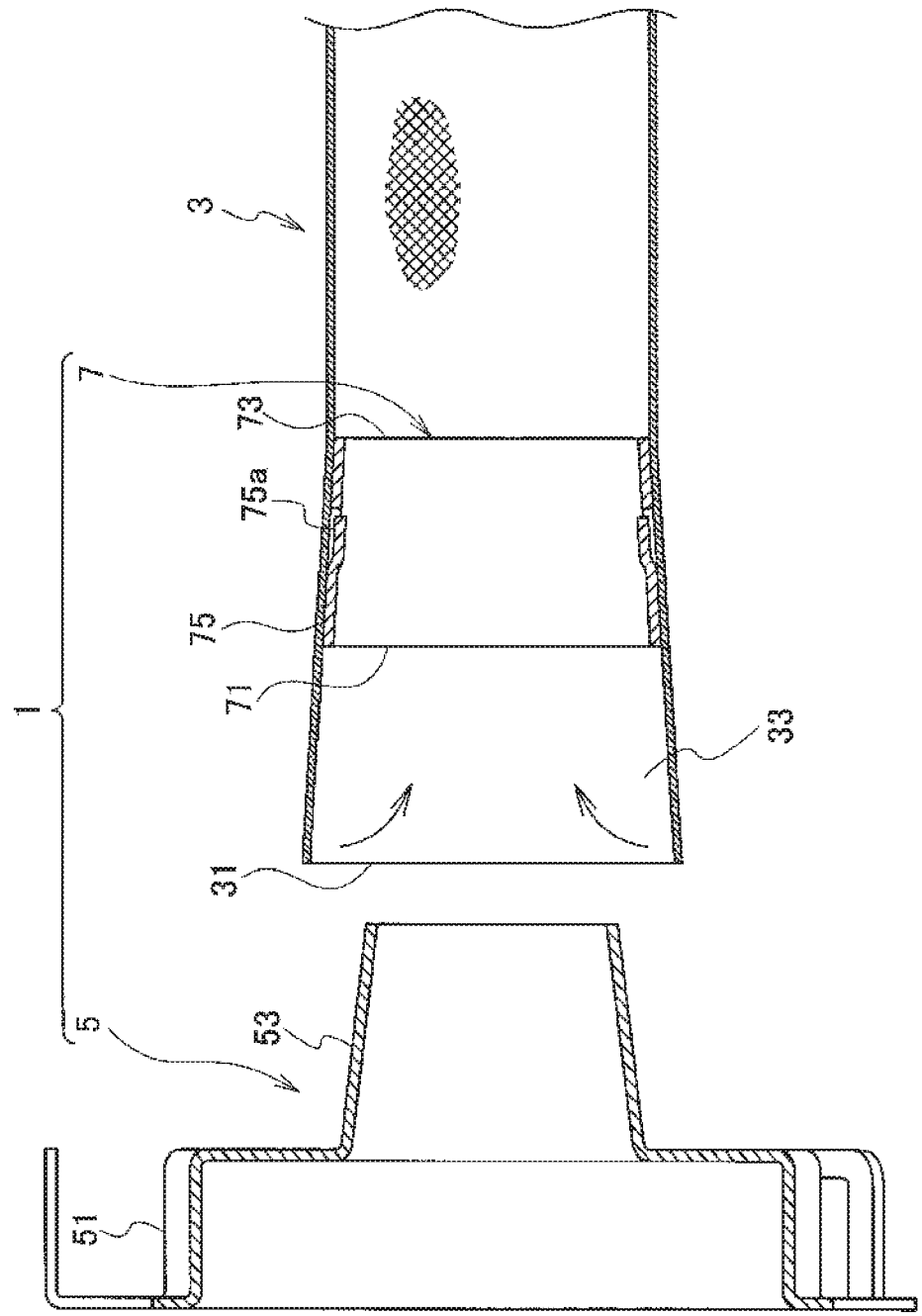
FIG. 2 is a sectional view illustrating the procedure of winding an end portion of a shielding member of FIG. 1 around a shielding ring.

First, as illustrated in FIG. 2, the end portion 33 of the shielding member 3 is enlarged to a size allowing an insertion of the shielding ring 7 into the end portion 33 and subsequently, the shielding ring 7 is inserted, from its side of the small diameter opening end 73, into the inside of the shielding member 3. Then, the end portion 33 of the shielding member 3, which is located closer to the opening 31 than the shielding ring 7, is folded back to the inside of the shielding ring 7, at the large diameter opening end 71.

Figure 3:
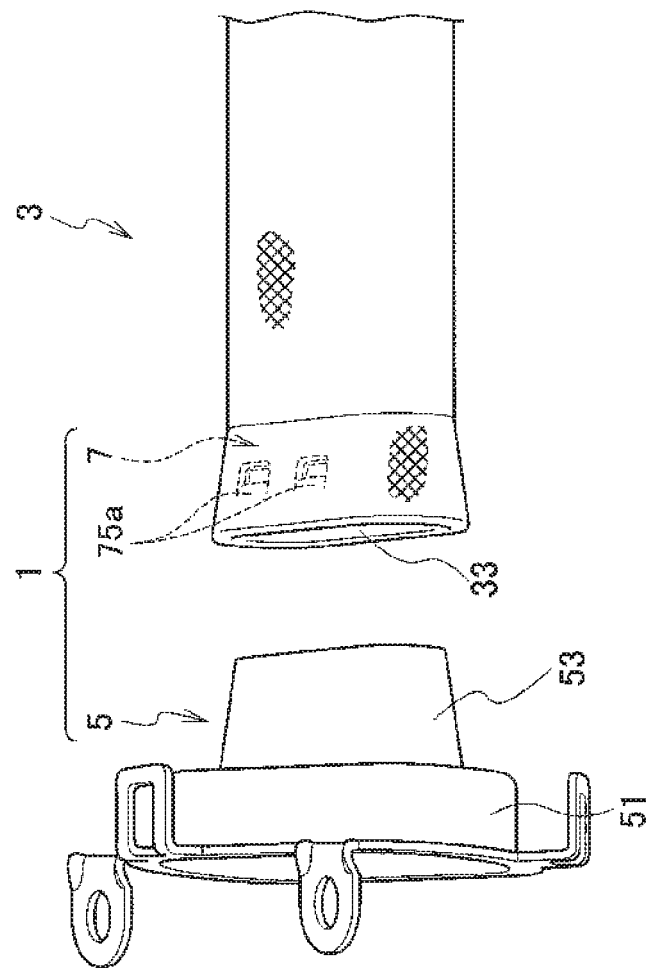
FIG. 3 is a perspective view illustrating a state where the end portion of the shielding member of FIG. 1 is folded back from an outer circumferential surface side toward the inner circumferential surface side of the shielding ring and subsequently wound round the shielding ring.
Figure 4:
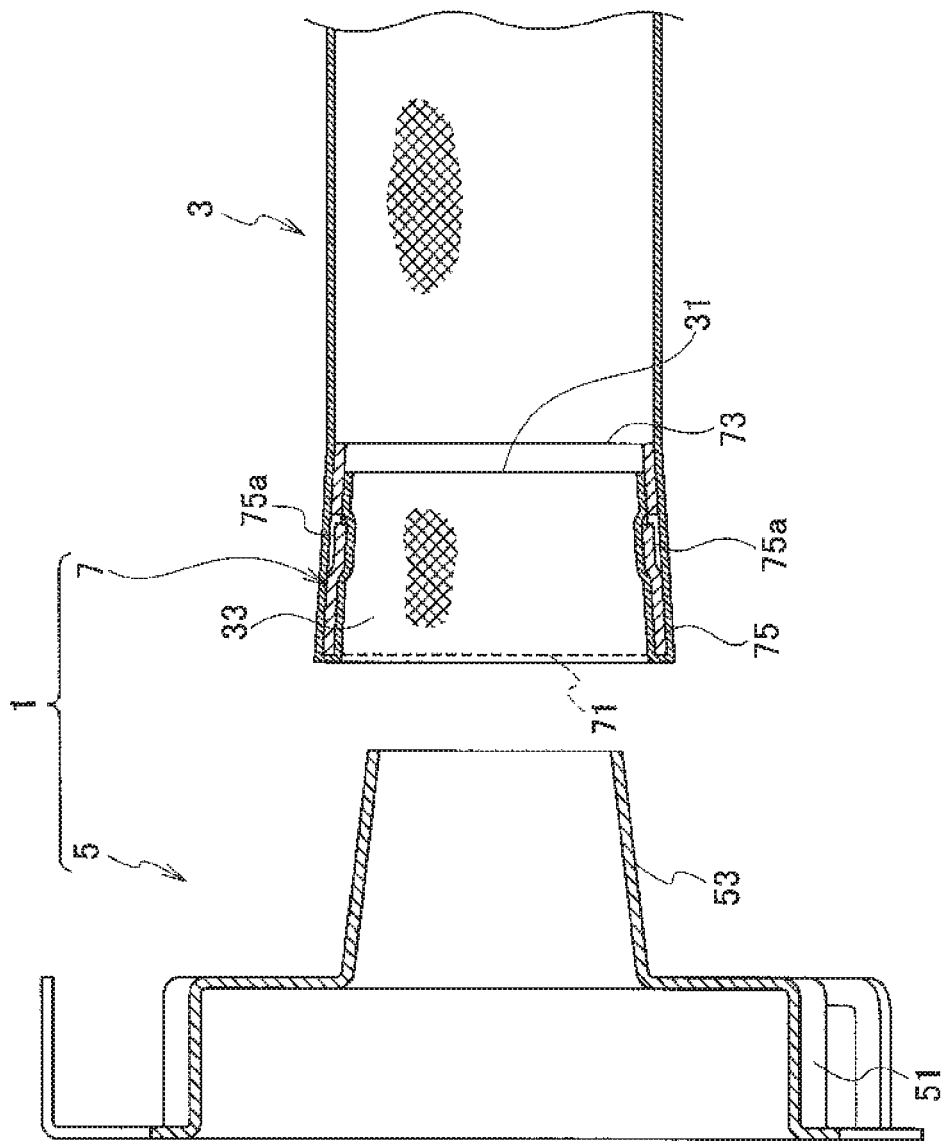
FIG. 4 is a perspective view illustrating a state where the end portion of the shielding member is wound against the shielding ring of FIG. 3.

As a result, as illustrated in FIG. 3, the end portion 33 of the shielding member 3 is folded back from the outer circumferential surface side to the inner circumferential surface side of the shielding ring 7, thereby realizing a state that the end portion 33 of the shielding member 3 is wound around the shielding ring 7. In this state, the opening 31 of the shielding member 3 is located on the side of the small diameter opening end 73 through the locking pieces 75a of the shielding ring 7, as illustrated in FIG. 4. If the shielding member 3 is a braided wire, it is possible to allow respective tips of the locking pieces 75a of the shielding ring 7 to be locked to meshes of the end portion 33 folded back to the inside, thereby preventing the end portion 33 from moving toward the large diameter opening end 71.

Figure 5:
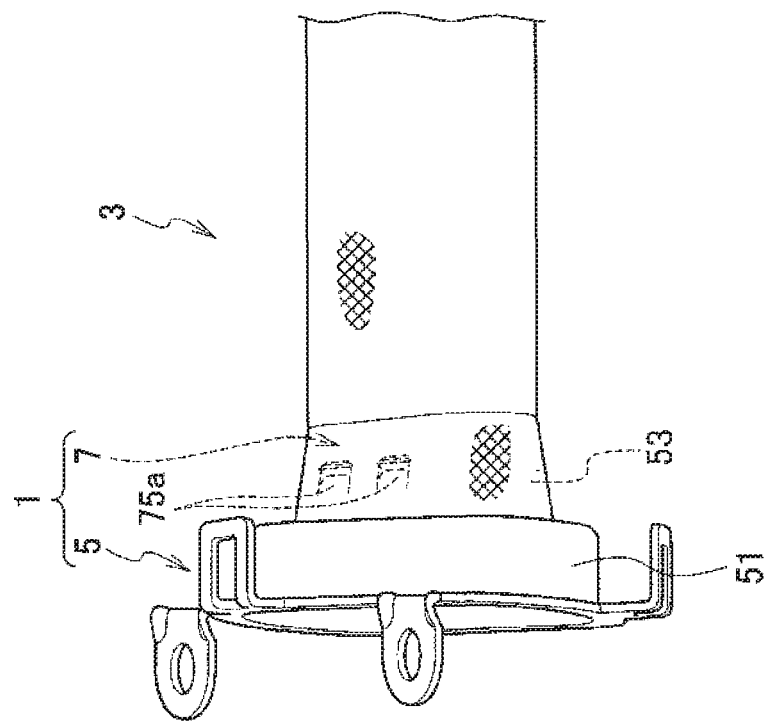
FIG. 5 is a perspective view illustrating a state where the end portion of the shielding member wound around the shielding ring of FIG. 4 is fitted to an outer circumferential surface of a small diameter portion of a shielding shell.

Next, as illustrated in FIG. 5, the smaller diameter portion 53 of the shielding shell 5 is press-fitted to the shielding ring 7 wound with the end portion 33 of the shielding member 3. At this time, the end portion 33 of the shielding member 3, which has been folded back to the inner circumferential surface side of the shielding ring 7, is brought into pressure contact with the outer circumferential surface of the small diameter portion 53 by the locking pieces 75a of the shielding ring 7.

Figure 6:
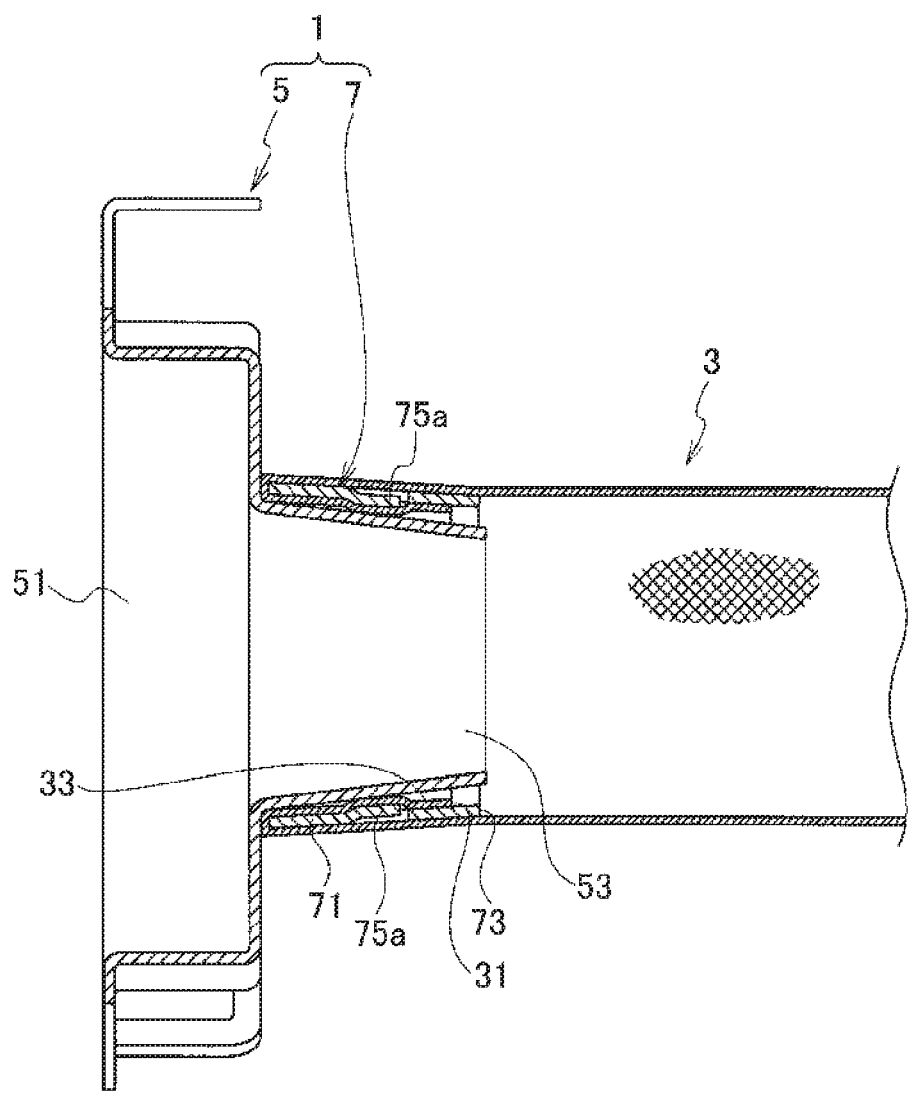
FIG. 6 is a sectional view illustrating a state where the small diameter portion of the shielding shell of FIG. 5 is press-fitted to the shielding ring.

Thus, as illustrated in FIG. 6, the end portion 33 of the shielding member 3 folded back to the inner circumferential surface side of the shielding ring 7 is sandwiched between the small diameter portion 53 of the shielding shell 5 and the shielding ring 7. Due to this sandwiching, the shielding member 3 is fixed to the shielding shell 5, so that the opening 31 of the shielding member 3 is prevented from being exposed to the outside and thus raveled.

In this way, in the shield unit 1 according to the embodiment, the small diameter portion 53 of the shielding shell 5 is press-fitted to the shielding ring 7 wound with the end portion 33 of the shielding member 3, and the end portion 33 of the shielding member 3 is sandwiched between the shielding ring 7 and the small diameter portion 53.

Therefore, with the arrangement where the end portion 33 of the shielding member 3 is folded back to the inside of the shielding ring 7, even if the position of the opening 31 is not grasped when press-fitting the smaller diameter portion 53 of the shielding shell to the e shielding ring 7, the opening 13 after press-fitting can be positioned in the interior of the shielding member 3 which is not exposed to the outside, certainly. Thus, the end portion 33 of the shielding member 3 can be easily attached and fixed to the shielding shell 5 so as not to be exposed to the outside.

In addition, when folding back the end portion 33 of the shielding member 3 from the outer circumferential surface side to the inner circumferential surface side of the shielding ring 7 thereby winding the end portion 33 of the shielding member 3 around the shielding ring 7, the shielding member 3 is locked to the peripheral portion of the shielding ring 7, in the folding-back portion of the shielding member 3. Due to this locking, the shielding member 3 is restricted from sliding against the shielding ring 7 for positional deviation when a tensile force is applied to the shielding member 3 in its extending direction.

Further, in the case where the shielding member 3 is the braided wire like the embodiment, a part of the end portion 33 of the shielding member 3 folded back to the inner circumferential surface side, which part does not overlap with the shielding ring 7, would be visible from the outside of the shielding member 3 through meshes because the braided wire is expanded to broaden the meshes in winding the end portion 33 of the shielding member 3 around the shielding ring 7.

For this reason, it is possible to visually confirm whether or not the tip of the end portion 33 of the shielding member 3 folded back inwardly has reached up to a position beyond the shielding ring 7, through the meshes of the shielding member 3.

As mentioned above, by making the shielding member 3 folded inwardly hardly slip in relation to the shielding ring 7 and also enabling an operator to confirm how far the tip of the end portion 33 of the shielding member 3, which is folded back to the inner circumferential surface side of the shielding ring 7, has reached, the small diameter portion 53 of the shielding shell 5 can be press-fitted to the shielding ring 7 while sufficiently maintaining the length of the end portion 33 of the shielding member 33 folded back to the inner circumferential surface side. Thus, it is possible to ensure a sufficient contact area between the shielding member 3 and the small diameter portion 53 of the shielding shell 5 reliably.

Figure 7:
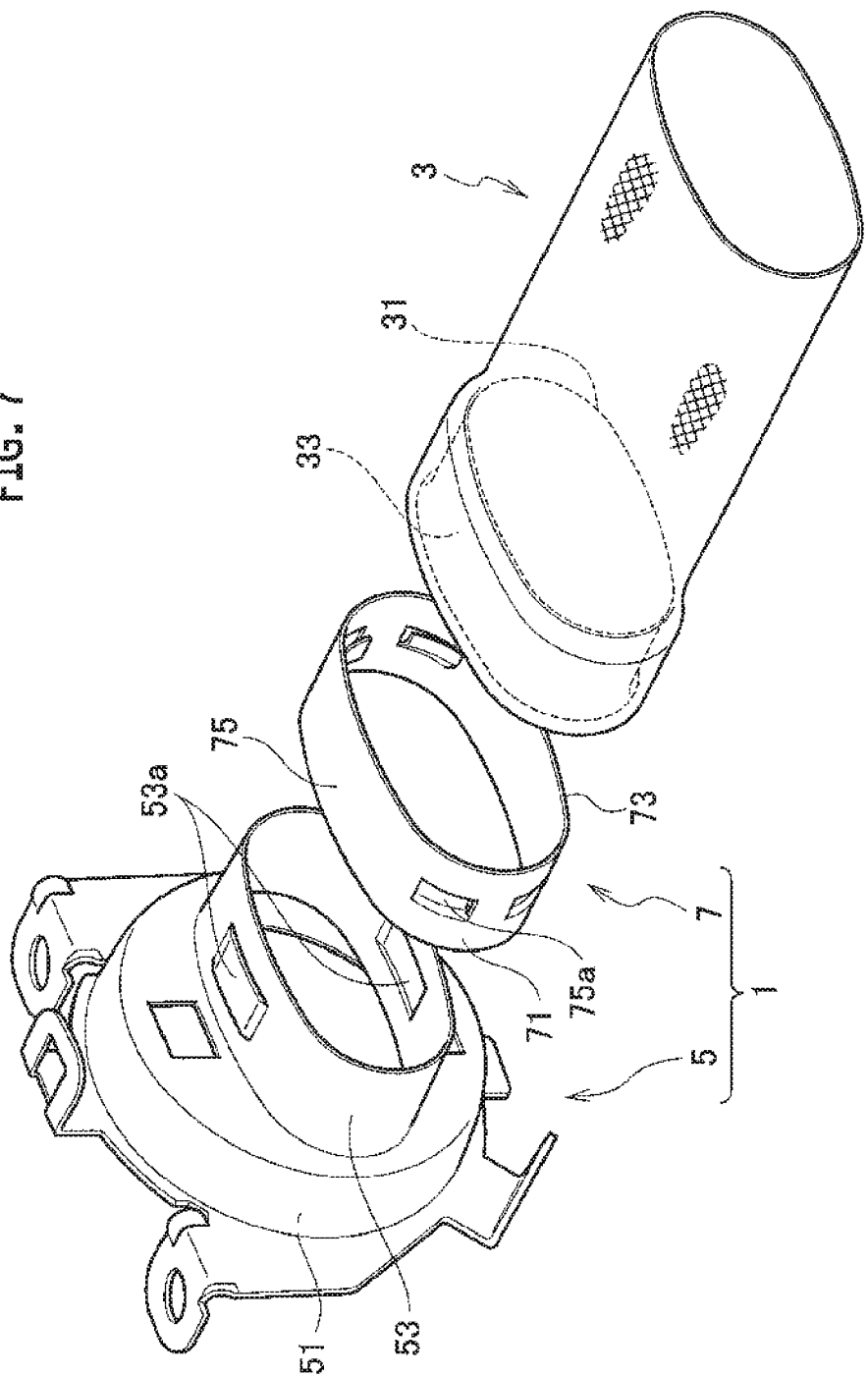
FIG. 7 is an exploded perspective view illustrating a shielding unit according to a modification of the embodiment.

Note that, as in a shielding unit 1 according to a modification of the embodiment illustrated in FIG. 7, arch-like elastic contact portions 53a bulging outward may be formed on flat portions of the small-diameter portion 53 of the shielding shell 5 by press working. The elastic contact portions 53a are brought into elastic contact with the end portion 33 of the shielding member 3 folded back to the inner circumferential surface side of the shielding ring 7 when the small diameter portion 53 is press-fitted to the shielding ring 7 wound with the end portion 33 of the shielding member 3.

Due to the elastic force of the elastic contact portions 53a, the end portion 33 of the shielding member 3 abuts on the elastic contact portions 53a and the shielding ring 7 with high contact pressure. Therefore, with the reduction of contact resistance between the shielding member 3 and the shielding shell 5 and also between the shielding member 3 and the shielding ring 7, it is possible to connect these elements with each other with excellent electrical conductivity.

In the case of forming the elastic contact portions 53a on the small diameter portion 53 of the shielding shell 5, it is desirable to shift the locking pieces 75a of the shielding ring 7 so as not to interfere with the elastic contact portions 53a, as illustrated in FIG. 7.

In order to make the so-shifted locking pieces 75a of the shielding ring 7 easy to be seen, incidentally, FIG. 7 illustrates a condition where the shielding member 3 with the end portion 33 folded back inward is separated from the shielding ring 7.

The locking pieces 75a may be eliminated from the shielding ring 7. However, since the end portion 33 of the shielding member can be temporarily fixed to the shielding ring 7 so as not to come off therefrom by the locking pieces 75a before press-fitting the smaller diameter portion 53 of the shielding shell 5 to the shielding ring 7, it is advantageous to provide the shielding ring 7 with the locking pieces 75a.

If the shielding ring 7 is provided with the locking pieces 75a, then the press-fitting of the small diameter portion 53 of the shielding shell 5 to the shielding ring 7 can be more strengthened by the small-diameter portion 53 in pressure contact with the locking pieces 75a. Therefore, it is unnecessary to form the shielding ring 7 or the smaller diameter portion 53 of the shielding shell 5 to a tapered shape in order to facilitate the press-fitting of the smaller diameter portion 53 to the shielding ring 7.

The shielding member 3 of the shielding unit 1 is not limited to the braided wire, as long as it is made from metallic material.

What is claimed is:

1. A shielding unit, comprising:
   a cylindrical shielding member having electrical conductivity;
   a shielding shell having a metal cylindrical portion to which an end portion of the shielding member is connected; and
   a shielding ring press-fitted to the cylindrical portion to fix the end portion of the shielding member to the cylindrical portion from an outside thereof, wherein
   the end portion of the shielding member is folded back from an outer circumferential surface side to an inner circumferential surface side of the shielding ring, thereby winding around the shielding ring,
   the end portion of the shielding member is sandwiched between the cylindrical portion and the shielding ring,
   the shielding ring includes a locking piece in a form of a cantilever extending to an inside of the shielding ring, and
   the end portion of the shielding member is brought into pressure contact with the cylindrical portion under a condition that the end portion of the shielding member is locked to the locking piece thereby preventing the end portion of the shielding member from coming off from the shielding ring.

2. The shielding unit of claim 1, wherein the cylindrical portion includes an elastic contact portion bulging radially outward, and the elastic contact portion allows the end portion of the shielding member folded back to the inner circumferential surface side of the shielding ring to come into pressure contact with the inner circumferential surface of the shielding ring on a condition of press-fitting the cylindrical portion to the shielding ring.

3. A shielding unit, comprising:

a cylindrical shielding member having electrical conductivity;

a shielding shell having a metal cylindrical portion to which an end portion of the shielding member is connected; and a shielding ring press-fitted to the cylindrical portion to fix the end portion of the shielding member to the cylindrical portion from an outside thereof, wherein the end portion of the shielding member is folded back from an outer circumferential surface side to an inner circumferential surface side of the shielding ring, thereby winding around the shielding ring, the end portion of the shielding member is sandwiched between the cylindrical portion and the shielding ring, the cylindrical portion includes an elastic contact portion bulging radially outward, and the elastic contact portion allows the end portion of the shielding member folded back to the inner circumferential surface side of the shielding ring to come into pressure contact with the inner circumferential surface of the shielding ring on a condition of press-fitting the cylindrical portion to the shielding ring.

* * * * *